United States Patent [19]
Luning

[11] Patent Number: 6,005,279
[45] Date of Patent: Dec. 21, 1999

[54] TRENCH EDGE SPACER FORMATION

[75] Inventor: Scott D. Luning, San Francisco, Calif.

[73] Assignee: Advanced Micro Devices, Inc., Sunnyvale, Calif.

[21] Appl. No.: 08/993,883

[22] Filed: Dec. 18, 1997

[51] Int. Cl.$^6$ .................................................. H01L 29/00
[52] U.S. Cl. ......................... 257/510; 257/513; 257/519; 257/374; 438/438; 438/435; 438/424
[58] Field of Search .................................. 257/510, 513, 257/519, 374, 647; 438/438, 446, 435, 424, 425, 426

[56] References Cited

U.S. PATENT DOCUMENTS

| | | | |
|---|---|---|---|
| 5,424,240 | 6/1995 | Han | 437/67 |
| 5,506,168 | 4/1996 | Morita et al. | 437/67 |
| 5,679,599 | 10/1997 | Mehta | 437/69 |
| 5,801,082 | 9/1998 | Tseng | 438/424 |
| 5,854,121 | 12/1998 | Gardner et al. | 438/425 |
| 5,872,045 | 2/1999 | Lou et al. | 438/432 |

FOREIGN PATENT DOCUMENTS

| | | | |
|---|---|---|---|
| 0 048 175 | 3/1982 | European Pat. Off. | 257/510 |
| 2-23630 | 1/1990 | Japan | 257/513 |

*Primary Examiner*—Mahshid Saadat
*Assistant Examiner*—H. D. Tran

[57] ABSTRACT

An insulating trench isolation structure is formed in a semiconductor substrate with a spacer overlying the trench edge to prevent oxide loss during subsequent etching, thereby preventing junction leakage, particulary upon silicidation. Embodiments include providing a step in the trench fill and forming the nitride spacer during gate electrode sidewall spacer formation. The protective nitride spacer etches more slowly than oxide and, hence, remains after subsequent oxide etching and cleaning.

10 Claims, 6 Drawing Sheets

TRENCH EDGE SPACER FORMATION

TECHNICAL FIELD

The present invention relates to a method of manufacturing a semiconductor device comprising trench isolation. The invention has particular applicability in manufacturing high density semiconductor devices with submicron design features and active regions isolated by shallow insulating trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate typically monocrystalline silicon or an epitaxial layer formed thereon, bounding the active regions.

One type of isolation structure is known as trench isolation, wherein shallow trenches are etched in the substrate, and an oxide liner is thermally grown on the trench walls. The trench is then refilled, such as with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor. After implantation of the substrate is completed, titanium or other silicide is typically formed on the gates and source/drain reunions to reduce sheet resistance in these areas, for increased performance.

A typical method of trench formation comprises initially growing, a pad oxide layer on the substrate, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicone dioxide interface quality. The trench is then refilled with an insulating material, such as silicon dioxide derived from tetraethyl oitlhosilicate (TEOS). The surface is then planarized, as by chemical-mechanical polishing (CMP), and the nitride and pad oxide are stripped of the active areas, to complete the trench isolation structure.

Well implants are then formed by appropriate masking and ion implantation. Subsequently, the surface is cleaned, a gate oxide layer is formed and a polycrystalline silicon layer is deposited and etched to form a gate electrode. Lightly-doped drain (LDD) or other source/drain implants are thereafter formed by appropriate masking and ion implantation. After LDD resist removal, a conformal layer of oxide or nitride is deposited and anisotropically etched to leave spacers along the edges of the gates, which prevent a subsequently applied heavy-dose source/drain implant from completely overlapping the lightly-doped LLD area next to the grates or other shallow source/drain regions. Ion implantation is then conducted to form source/drain regions, with subsequent activation to complete the transistor structure.

A titanium silicide layer is then formed on the gates and source/drain regions, as by sputtering titanium and rapid thermal annealing (RTA). It may be desirable to prevent the silicidation of selected gate and source/drain regions, for example, in order to form a ballast resistor for electrostatic discharge (ESD) protection circuitry. To create unsilicided gate and source/drain regions a thin resistor protective oxide is deposited before sputtering titanium on the substrate. and appropriate portions of the resistor protective oxide are etched away (this step is referred to as the "resistor protect etch"). After the resist is etched and titanium is deposited, the oxide remaining prevents the formation of silicide in the desired areas.

When creating the STI structure, it is considered desirable for the uppermost surface of the substrate to he flush (i.e., co-planar) with the uppermost surface of the oxide filling the trench at the edges of the trench, in order to maximize the performance of the finished device, and to provide a flat topography for subsequent processing steps, particularly photolithographic processing, thereby facilitating the formation of small features with accuracy and increased manufacturing throughput. However as shown in FIG. 1 the interface of the substrate and the oxide 2 typically exhibits what is referred to as a "wrap-around"; that is, a dip 2a is formed in the oxide 2 at the trench edge 1a. Dip 2a is created during the removal of the pad oxide by overetching to ensure complete removal of the pad oxide.

During processing steps performed after gate electrode formation, such as pre-cleaning steps and the resistor protect etch, the oxide at the trench edges is further eroded, effectively increasing the size of the dip 2a. This oxide loss is disadvantageous when it occurs after impurities have been implanted close to the upper surface of the substrate to form junctions; for example, after LDD and source/drain implant steps. As illustrated in FIG. 2, the depth d of such a junction 3 is referenced to the upper exposed surface 1b of the substrate 1 when the junction 3 is formed. The junction 3 follows the contour of the upper exposed surface 1b of the substrate, so the upper surface 1b and the junction 3 are at roughly a constant distance apart.

Thus, any subsequent oxide loss will reduce the distance between part of the junction 3 and the upper exposed surface 1b of the substrate 1. This is illustrated in FIG. 3, where the original oxide surface $2_o$) has been eroded to a lower level $2_i$, which causes portion 3a of the junction 3 to be closer to the upper exposed surface of the substrate (i.e., at depth d') than it was prior to the unintended oxide removal. since more of the substrate surface is exposed. This unwanted oxide removal and resultant proximity of the junction to the surface 1b causes problems such as junction leakage when metal silicide layer 4 is formed on substrate surface 1b, thereby adversely affecting, device performance.

There exists a need for a semiconductor device and a method of manufacturing a semiconductor device wherein oxide loss at the edges of isolation trenches during post gate processing, is minimized, thereby reducing junction leakage.

SUMMARY OF THE INVENTION

An object of the present invention is a method of manufacturing a semiconductor device having an insulating trench formed in a semiconductor substrate and junctions of high quality Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing, a semiconductor device having an insulated trench formed in a semiconductor substrate or in an epitaxial layer on the semiconductor substrate, which method comprises; forming a trench opening thermally growing an oxide liner on an internal surface of the trench and abutting a main surface of the substrate or epitaxial layer; filling the trench with an insulating material; depositing a protective layer having an etch rate less than the oxide liner and the insulating material on the main surface covering an exposed upper edge of the trench where the main surface abuts the liner; and anisotropically etching the protective layer to form a protective spacer on the trench edge.

Another aspect of the present invention is a method of manufacturing an integrated circuit comprising: forming a silicon oxide pad layer on a main surface of the substrate or an epitaxial layer formed on the substrate; forming a silicon nitride barrier layer on the silicon oxide pad layer; providing a photoresist mask on the silicon nitride barrier layer the mask containing a pattern having an opening for a trench; etching to remove portions of the underlying barrier nitride and pad oxide layers to form side surfaces thereon, and to form the trench having an internal surface with side surfaces, wherein the side surfaces of the silicon nitride barrier and silicon oxide pad layers and trench are substantially vertically aligned; thermally growing a thin silicon oxide liner on the internal surface of the trench and abutting the main surface, the liner having a predetermined thickness of about 100 Å to about 1000 Å; depositing an insulating material to fill the trench and cover the silicon nitride barrier layer, the insulating material comprising silicon dioxide derived from tetraethiyl orthiosilicate (TEOS) by low pressure chemical vapor deposition (LPCVD) silicon dioxide derived from silane by LPCVD or a high density plasma oxide, the insulating material having a step originating at an uppermost surface of the liner spaced apart from the trench edge a substantially horizontal distance; planiarizinig the insulating material by chemical-mechanical polishing such that the step has a substantially vertical height about equal to or greater than the substantially horizontal distance which height is about 400 Å to about 1400 Å; removing the barrier nitride layer and the pad oxide layer; implanting impurities to form doped regions in the semiconductor substrate; forming a silicon oxide dielectric layer on the main surface of the semiconductor substrate or the epitaxial layer formed on the substrate; forming a doped polycrystalline silicon conductive layer on the dielectric layer; patterning tile conductive layer to form a gate electrode having substantially vertical side surfaces; depositing a protective nitride layer to cover the main surface of the semiconductor substrate; and anisotropically etching the protective nitride layer to form a protective spacer on the trench edge where the main surface abuts the liner and to form sidewall spacers on the substantially vertical side surfaces of the gate electrode such that the sidewall spacers have a predetermined width of about 100 Å to about 1000 Å, and such that the protective spacer has a width less than or about equal to the width of the sidewall spacers.

A still further aspect of the present invention is a semiconductor device having, a trench formed in a substrate or in an epitaxial layer formed in the substrate, the trench having an edge at a main surface of the substrate or epitaxial layer; a thermally grown oxide liner in the trench abutting the main surface; an insulating material filling the trench; impurities implanted in the substrate or epitaxial layer; and a spacer formed on the trench where tile liner abuts the main surface for protecting the edge from subsequent etching.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The present invention addresses and solves the oxide loss problems attendant upon conventional STI methodology, thereby reducing junction leakage. According to the methodology of the present invention, after a trench is formed in a semiconductor substrate (or epitaxial layer formed on a semiconductor substrate) and refilled with an insulating material (typically silicon dioxide), a spacer having an etch rate slower than the insulating material (typically silicon nitride) is formed at a strategic location along the trench edge to reduce oxide loss and, hence, maintain junction depths. Since the trench edge is covered by the nitride spacer, it is protected from oxide loss during subsequent processing operations, especially oxide etching and cleaning operations. Because nitride does not etch as quickly as oxide, the nitride spacer will remain when subsequent oxide etches and cleanings are performed. Thus, problems caused by oxide loss, such as junction leakage, are successfully avoided.

Figure 1:
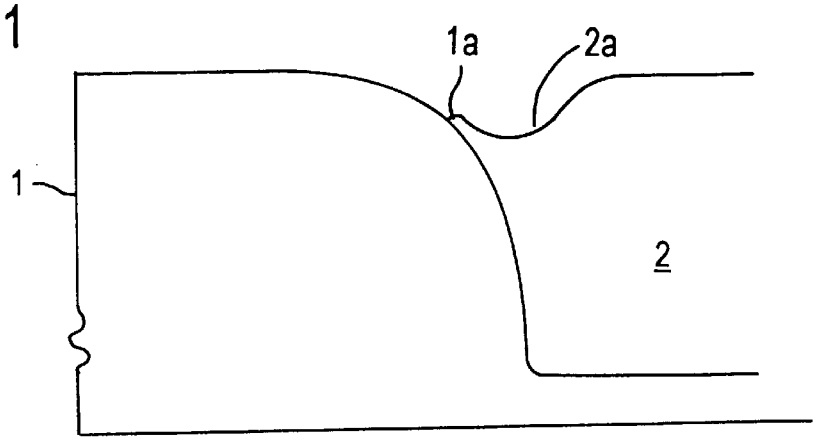
FIG. 1 schematically illustrates the trench/substrate interface of a conventional semiconductor device.
Figure 2:
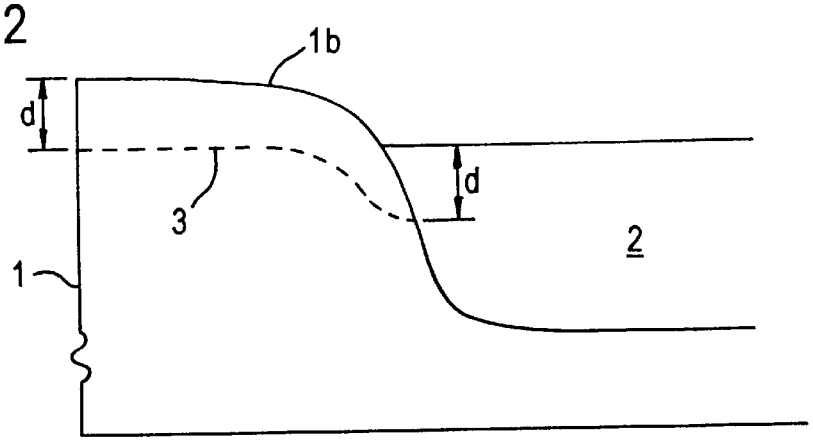
FIG. 2 schematically illustrates the trench/substrate interface of a conventional semiconductor device as it relates to an implanted junction.
Figure 3:
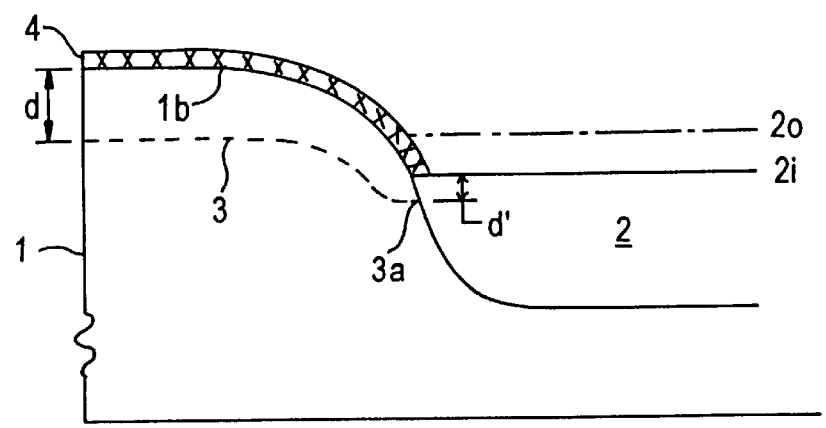
FIG. 3 schematically illustrates the undesirable oxide loss attendant upon conventional practices.
Figure 4A:
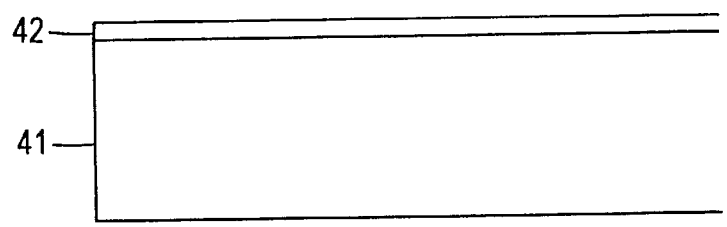
FIGS. 4A–4N schematically illustrate sequential phases of a method in accordance with all embodiment of the present invention.
Figure 4B:
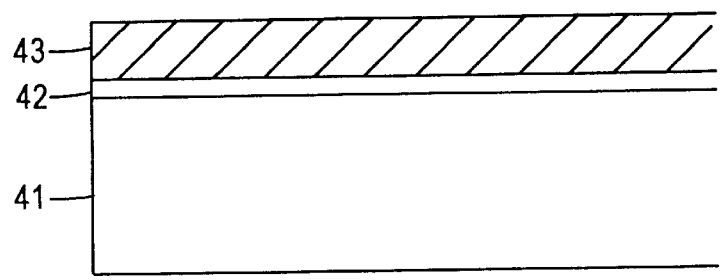
Figure 4C:
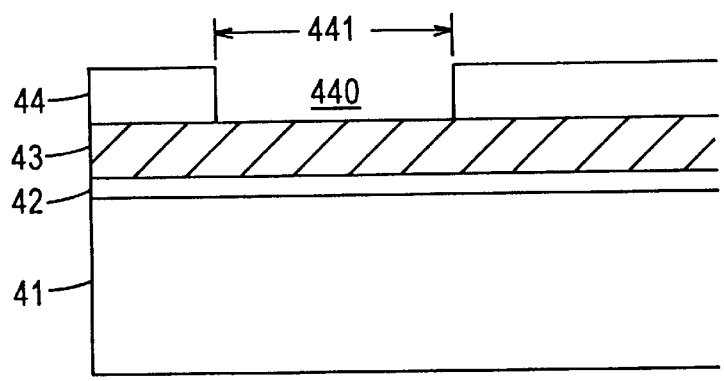
Figure 4D:
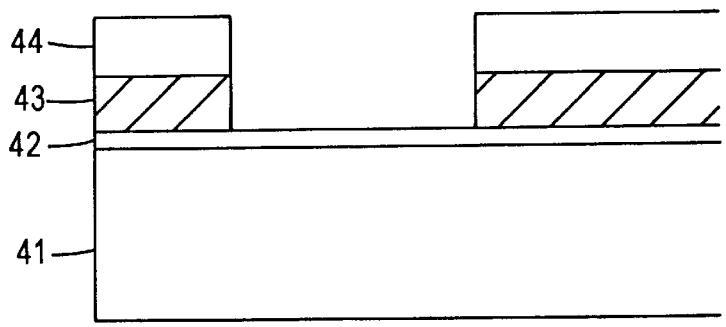
Figure 4E:
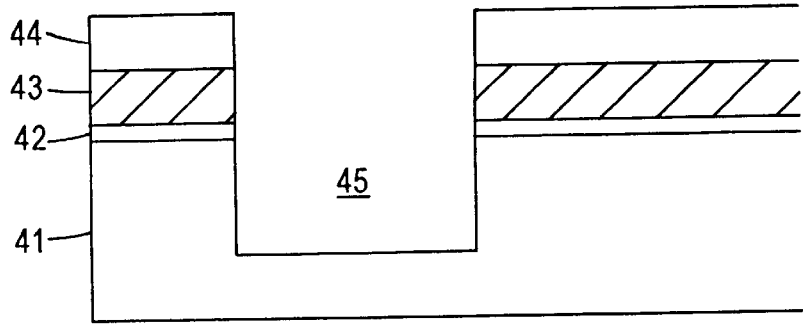
Figure 4F:
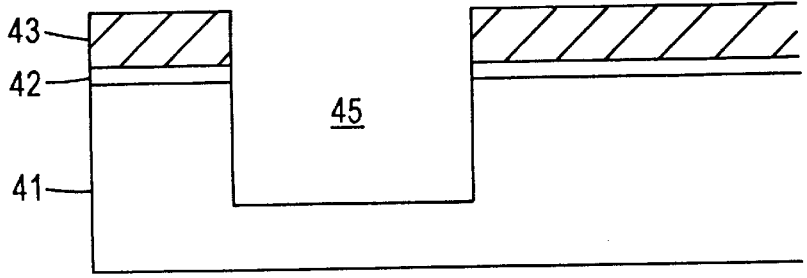
Figure 4G:
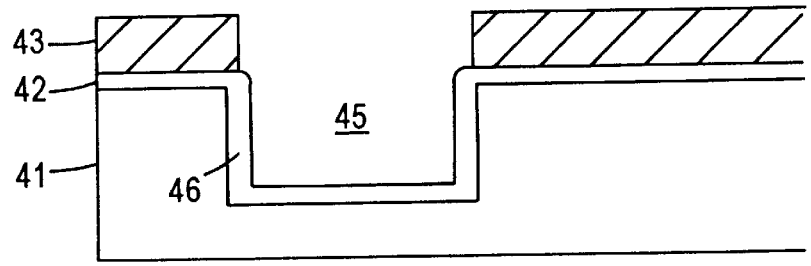
Figure 4H:
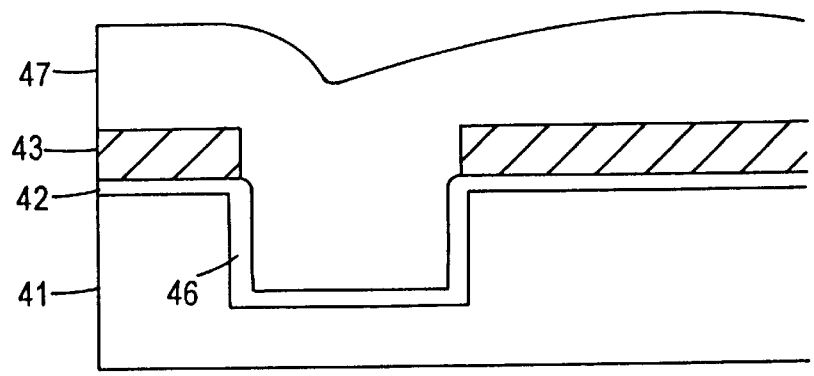
Figure 4I:
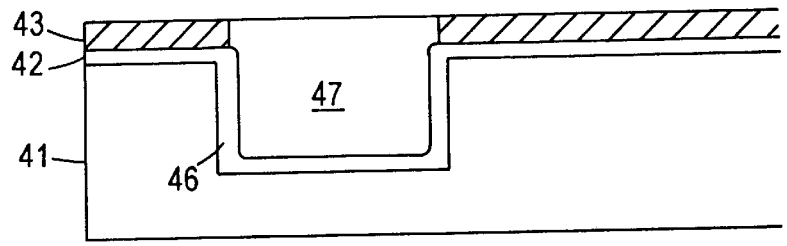
Figure 4J:
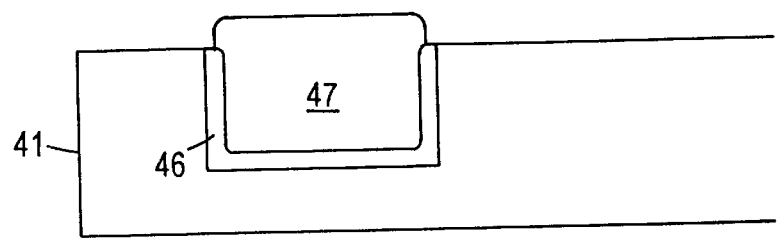
Figure 4K:
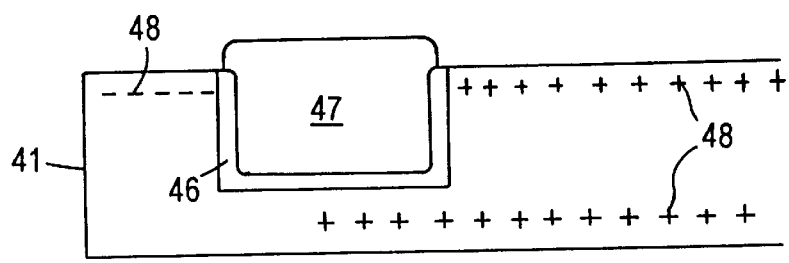
Figure 4L:
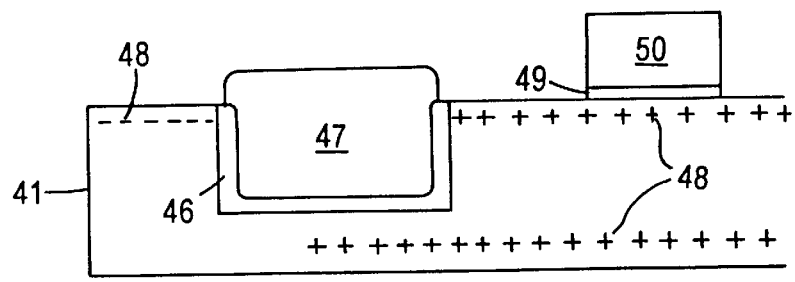
Figure 4M:
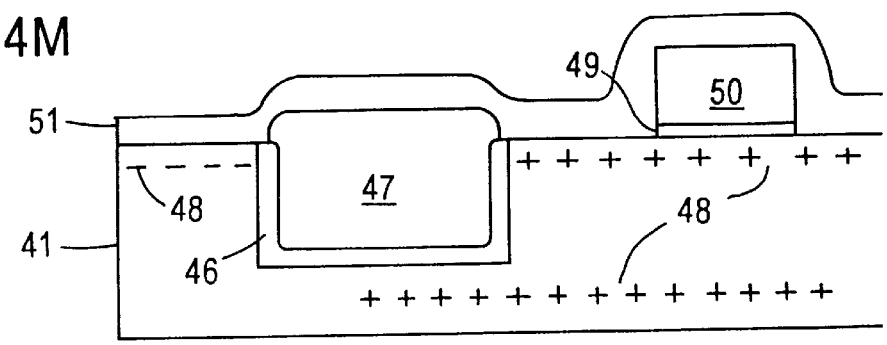
Figure 4N:
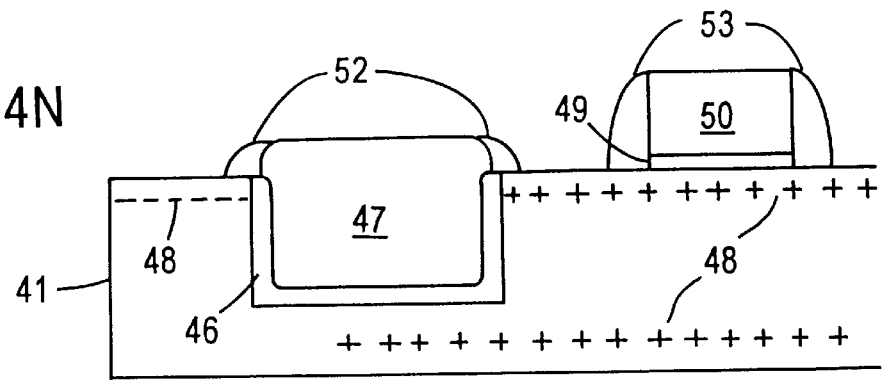
Figure 5:
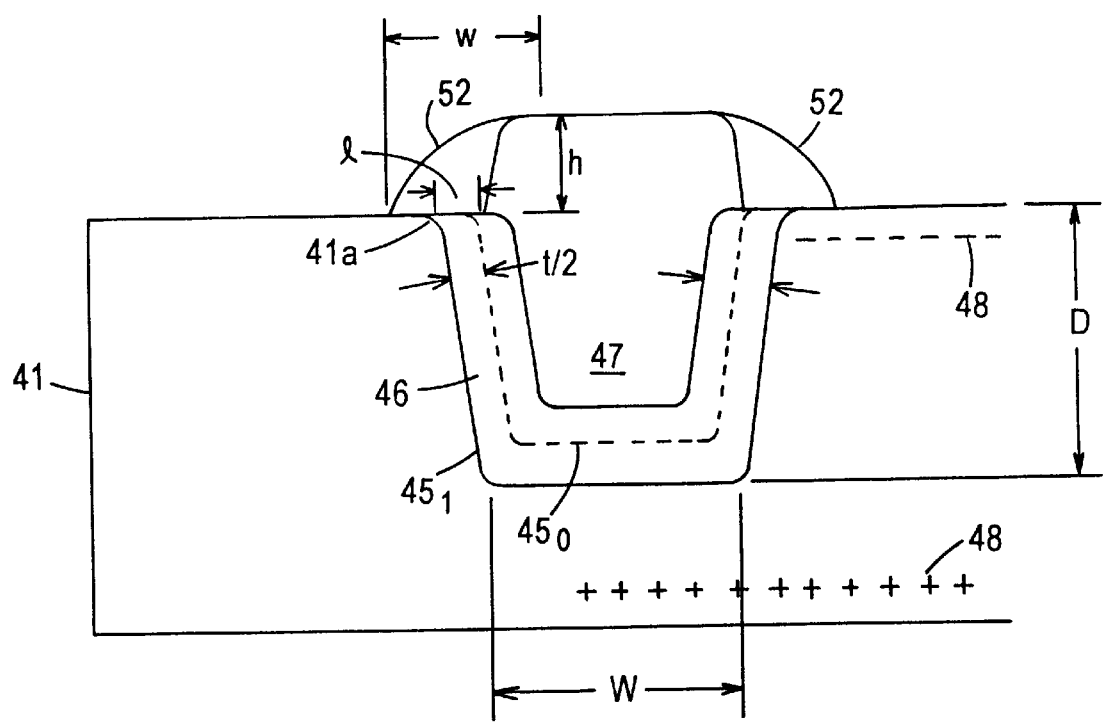
FIG. 5 schematically illustrates a semiconductor device according to the present invention.

An embodiment of the present invention is illustrated in FIGS. 4A–4N, illustrating sequential phases in forming a semiconductor device in accordance with the present invention, and in FIG. 5, which is a cross-sectionial view of a trench edge and spacer produced in accordance with the inventive method. Referring to FIG. 4A, a substrate 41 is prepared having a substantially planar surface, typically a semiconductor substrate comprising doped monocrystalline silicon or an epitaxial layer formed on a semiconductor substrate in accordance with conventional practices. A pad oxide layer 42 is then grown on the substrate 41. Pad oxide layer 42 is typically silicon oxide and can be thermally grown on the substrate or deposited by chemical vapor deposition (CVD). In another embodiment, a pad oxide containing a thermally-grown or deposited silicon oxide layer and a buffer polycrystalline silicon layer is employed as the pad layer. FIG. 4A illustrates silicon substrate 41 and the pad oxide layer 42.

After formation of tile pad oxide layer 42, a barrier nitride layer 43 is deposited on the pad oxide layer 42 as shown in FIG. 4B. such as a silicon nitride layer by CVD. Silicon oxide pad layer 42 functions as a buffer layer cushioning stresses between substrate 41 and barrier nitride layer 43. Barrier nitride layer 43 functions as an oxidation mask as it is resistant to the diffusion of oxygen and water vapor therethrough, thereby preventing, an oxidizing species from reaching the underlying silicon substrate, as well as acting as a polish stop.

A photoresist mask 44 is then formed on barrier nitride layer 43, as shown in FIG. 4C. Photoresist mask 44 has a pattern defined by openings 440, which have a width 441 substantially corresponding to the width of tile subsequently formed trench, such as about 0.25 μ or less. The barrier nitride layer 43 is then etched away as shown in FIG. 4E). The etching continues through the pad oxide layer 42 and into the substrate 41 to form the shallow trench 45 whose inner, surfaces are substantially vertically aligned with the barrier nitride layer 43 and the pad oxide layer 42, as shown in FIG. 4E. The trench 45 is typically etched to a depth of about 2500 Å to about 4000Å. In practicing the present invention, a trench depth of about 3000 Å has been found particularly suitable. When the etching of the trench 45 is completed, the photoresist 44 is stripped off the barrier nitride layer 43. resulting in the trench shown in FIG. 4F.

Thereafter, the trench surface is thermally oxidized to form an oxide liner 46 on the inner surface of trench 45, typically at a temperature of about 1000° C. or higher. As the oxide liner 46 is grown it consumes the inner surface of the trench, effectively shifting the position of the inner surface of the trench into the substrate 41, such that the barrier nitride layer 43 and the inner surface of the trench are no longer substantially vertically aligned. The thickness of the liner is controlled so that a step in the subsequently deposited trench fill resulting from this lack of vertical alignment is formed at a strategic position to enable effective formation of the protective nitride spacer at the trench edge. FIG. 4 shows the trench 45 with the completed liner 46. Subsequent to formation of the oxide liner 46, trench 45 is filled with a suitable insulating, material 47, as shown in FIG. 4H. Such insulating material can comprise silicon dioxide derived from TEOS by LPCVD or derived from silane by LPCVD. The trench 45 can also be filled with a high density plasma (HPD) oxide, preferably employing the methodology disclosed in copending application Ser. No. 08/924,133, filed Sep. 5, 1997 (Our Docket No. 1033-352), the entire disclosure of which is hereby incorporated herein by reference. Subsequent to trench filling, planarization is effected, such as by CMIP, as shown in FIG. 4I. The barrier nitride layer 43 and the pad oxide layer 42 are then stripped of leaving the completed STI structure shown in FIG. 4J.

Impurities are then implanted in the substrate 41 to form doped regions, such as shown in FIG. 4K as reference numeral 48. As recognized by those skilled in the art, such implants can be field implants or channel implants, which include the sub-steps of depositing and etching a photoresist mask that defines the n-channel and p-channel regions.

Next, the gates are formed by first growing a silicon dioxide dielectric layer, called the gate oxide,' on the active areas of the substrate. Then, a conductive layer of polycrystalline silicon is deposited overlying the gate oxide. The conductive polycrystalline silicon is patterned by depositing and etching a photoresist mask to form a gate electrode having substantially vertical side surfaces. The completed gate structure, including gate oxide 49 and gate electrode 50, is shown in FIG. 4L.

A conformal layer of silicon nitride 51 is then deposited on the main surface of the substrate 41, as illustrated in FIG. 4M. An oxide buffer layer may be deposited or grown on the main surface prior to deposition of the silicon nitride layer 51. Thereafter, the nitride layer 51 is anisotropically etched to form sidewall spacers 53 on the vertical sides of the rate electrode 50, and to form protective spacers 52 overlying the trench edges.

Subsequent to completion of the above-described inventive method, ion implantation is conducted to form source/drain regions, with subsequent activation to complete the transistor structure. Ballast resistors and a silicide layer may then be formed, and because of the presence of the protective spacers 52, the insulating material 47 will not be further eroded near the trench edges and the depth of the implanted impurities 48 will be maintained.

Referring to FIG. 5, the step in insulating trench fill 47 must be strategically formed with a geometric configuration to enable formation of protective nitride spacer 52 during the anisotropic etching, of the nitride layer 51; i.e., the step in insulating material 47 near the trench edge 41a must be properly sized and positioned. Such strategic positioning depends on various parameters including the thickness of the oxide liner. The step originates substantially at an uppermost surface of the liner 46 spaced apart from the trench edge 41a by a substantially horizontal distance 1. The distance 1 is dependent upon the thickness t of the liner oxide 46. As the oxide liner 46 is thermally grown it "eats" into the trench wall $45_0$ about half its thickness t, effectively shifting, the trench wall $45_0$ into the substrate a distance of about t/2. The post-liner trench wall is represented by reference numeral $45_1$. Since the barrier nitride layer 43 (which was originally vertically aligned with the trench wall $45_0$, as shown in FIG. 4E) does not shift when the liner 46 is grown, a step is created in the insulating material 47 having the horizontal dimension 1 of about t/2. To effectively protect the trench against oxide loss, the spacer 52 must have a width w equal to or greater than the distance 1. For the purposes of the present invention, it is desirable to maintain the step close to the trench edge 41a; that is, the distance 1, and thus the liner thickness t, should preferably kept small, because l tends to become larger as the insulating material 47 is eroded in etching and cleaning steps performed after the step is created and before the protective spacer 52 is formed, thus necessitating a larger and less easily formed width w for the protective spacer 52.

The step should have a height h about equal to or greater than the distance 1 of the step, to provide a substantially vertical surface for the spacer 52 to form. The height of the step is dependent upon the extent to which planarizing is conducted; i.e., the amount that barrier nitride 43 and insulating, material 47 are polished by CMP (see FIG. 4I).

In practicing the present invention, the absolute dimensions of the step and spacer 52 are selected depending upon the width of the sidewall spacers 53 (see FIG. 4N), which is usually predetermined by the design parameters of the semiconductor device. Due to the nature of the anisotropic etching process, the width of the sidewall spacers 53 and the width w of the protective spacers 52 are typically about equal at the end of the etching process. Therefore, to ensure that the protective spacer 52 is formed and adequately protects the trench edge 41a, the required width w of the protective spacer 52 must be less than or about equal to the width of the sidewall spacers 53. The step dimensions l and h, and thereby the thickness t of the liner 46, are selected accordingly. For example, in a semiconductor device wherein the width of sidewall spacers 53 is typically between about 100 Å and about 1000 Å, the width w of the protective nitride spacers 52 is typically about 100 Å to about 1000 Å. Accordingly, the liner oxide thickness t is controlled between about 100 Å and about 1000 Å, to create an initial distance l of about t/2. The height h would typically be controlled between about 400 Å to about 1400 Å. Alternately, the width w of the spacer 52, the distance l. and the height h of the step can have substantially the same dimensions.

An embodiment of a semiconductor device in accordance with the present invention is described with reference to FIG. 5. The semiconductor device comprises a trench formed in a substrate 41 or in an epitaxial layer formed in substrate 41, a thermally grown oxide liner 46 on a surface layer of the trench, an insulating material 47, such as silicon oxide, filling the trench, implanted impurities 48, and a protective spacer 52 such as silicon nitride overlying an upper edge 41a of the trench vicinal to where an uppermost surface of the substrate 41 abuts the liner 46. The insulating material 47 is purposefully formed with a step, originating at an uppermost Surface of liner 46 spaced apart from the trench edge 41a by a substantially horizontal dimension l about equal to half the thickness t of liner 46. Note that the distance l may subsequently become greater than half the thickness t, due to cleaning and/or etching steps performed between the formation of the step and the formation of protective spacer 52. The step has a height h about equal to or greater than the distance l, and the spacer 52 has a width w about equal to or greater than the distance l.

The trench 45 typically has a width W of about 0.25 Å or less, and a depth D of about 2500 Å to about 4000 Å; e.g., about 3000 Å. The height h of the step is typically about 400 Å to about 1400 Å, and the width of the spacer 52 is typically about 100 Å to about 1000 Å. In an alternate embodiment, the height h of the step, the distance l and the width w of the spacer 52 are substantially the same.

The semiconductor device with trench edge spacer formed in accordance with the present invention enables subsequent processing steps to be carried out without oxide loss from the trench edge, thereby reducing the possibility of junction leakage and an attendant reduction of performance in the completed device. The present invention is applicable to the manufacture of various types of semiconductor devices having STI, particularly high density semiconductor devices having a design rule of about 0.25 $\mu$ and under.

The present invention can be practiced by employing conventional materials, methodology and equipment. Accordingly, the details of such materials, equipment and methodology are not set forth herein in detail.

In the previous descriptions, numerous specific details are set forth, such as specific materials, structures, chemicals, processes, etc., in order to provide a thorough understanding of the present invention. However, as one having ordinary skill in the art would recognize the present invention can be practiced without resorting to the details specifically set forth. In other instances, well known processing structures have not been described in details in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A semiconductor device formed on a semiconductor substrate, comprising:

a trench formed in said substrate or in an epitaxial layer formed in said substrate, said trench having an edge at a main surface of said substrate or epitaxial layer;

a thermally grown oxide liner in said trench abutting said main surface;

an insulating material filling said trench;

impurities implanted in said substrate or epitaxial layer; and a spacer, comprising a material having a slower etch rate than said insulating material, directly overlying said trench edge where said liner abuts said main surface for protecting said edge from subsequent etching.

2. A semiconductor device as recited in claim 1, wherein said liner has a predetermined thickness;

wherein said insulating material has a step originating at an uppermost surface of said liner spaced apart from said trench edge by a substantially horizontal distance, said step having a height about equal to or greater than said substantially horizontal distance; and wherein said spacer has a width about equal to or greater than said substantially horizontal distance.

3. A semiconductor device as recited in claim 1, wherein said trench has a width of about 0.25 $\mu$ or less.

4. A semiconductor device as recited in claim 3, wherein said trench has a depth of about 2500 Å to about 4000 Å.

5. A semiconductor device as recited in claim 2, wherein said substantially horizontal distance is about one half the thickness of said liner.

6. A semiconductor device as recited in claim 5, wherein said thickness of said liner is about 100 Å to about 1000 Å.

7. A semiconductor device as recited in claim 6, wherein said height of said step is about 400 Å to about 1400 Å.

8. A semiconductor device as recited in claim 7 wherein said width of said spacer is about 100 Å to about 1000 Å.

9. A semiconductor device as recited in claim 2, wherein said height of said step, said substanitially horizontal distance, and said width of said spacer are about equal to each other.

10. A semiconiductor device as recited in claim 1, wherein said spacer comprises silicon nitride and said insulating, material comprises silicon oxide.

* * * * *